United States Patent [19]

Ono et al.

[11] Patent Number: 5,008,531

[45] Date of Patent: Apr. 16, 1991

[54] PULSED LIGHT IDENTIFYING SYSTEM

[75] Inventors: Shoichi Ono, Suwa; Atsuhito Kobayashi, Okaya, both of Japan

[73] Assignee: Chinon Kabushiki Kaisha, Suwa, Japan

[21] Appl. No.: 394,067

[22] Filed: Aug. 15, 1989

[51] Int. Cl.[5] .......................... G01V 9/04; H01J 40/14

[52] U.S. Cl. ................................. 250/222.1; 250/221; 250/214 R

[58] Field of Search ......... 250/222.1, 214 B, 214 SW, 250/214 L, 221, 214 R; 340/555, 556, 557

[56] References Cited

U.S. PATENT DOCUMENTS

| | | | |
|---|---|---|---|
| 3,708,678 | 1/1973 | Kreda | 250/566 |
| 4,047,023 | 9/1977 | Key et al. | 250/214 B |
| 4,247,767 | 1/1981 | O'Brien et al. | 250/221 |
| 4,786,800 | 11/1988 | Kamen | 250/222.1 |
| 4,822,996 | 4/1989 | Lind | 250/222.1 |
| 4,829,174 | 5/1989 | Booth et al. | 250/222.1 |
| 4,851,660 | 7/1989 | Juds et al. | 250/214 L |
| 4,851,661 | 7/1989 | Everett, Jr. | 250/222.1 |
| 4,851,689 | 7/1989 | Hasegawa | 250/214 B |

FOREIGN PATENT DOCUMENTS 0202601 11/1986 European Pat. Off. .

*Primary Examiner*—David C. Nelms
*Assistant Examiner*—Michael Messinger
*Attorney, Agent, or Firm*—Morrison Law Firm

[57] ABSTRACT

A light identifying system includes a photoelectric conversion unit for receiving a pulsed light from a light emitting part on a light receiving part to generate a light reception signal that varies in magnitude according to the quantity of the received light. A peak holding circuit has a time constant that is long compared with the pulse interval of the pulsed light. The peak holding circuit stores a peak value of the light reception signal for its time constant. The peak value is divided by a constant for application to a comparator. The comparator compares it with the light reception signal as a threshold. A peak value of the light reception signal is held, and the peak value thus held is specified as a threshold to the light reception signal, therefore in the unlikely event of decrease in the quantity of emitted light due to a secular change or of decrease in the quantity of received light due to mist and oil film, the threshold decreases accordingly.

5 Claims, 3 Drawing Sheets

OUTPUT
AND
35
21
20
28
29
33
34
27
25
32
26
31
23
19
LIGHT RECEPTION SIGNAL

PULSED LIGHT IDENTIFYING SYSTEM

BACKGROUND OF THE INVENTION

1. Field of the Invention

This invention relates to a light identifying system used on photoelectric switchs, measuring apparatus and others for identifying whether or not light from a light emitting part is received.

2. Description of the Prior Art

A prior art light identifying circuit will be described with reference to FIG. 5. In the drawing, reference numeral 11 denotes a light emitting part and 12 denotes a light receiving part, disposed opposite each other. When used as an optical switch, an object (moving member) 15 may be interposed between the light emitting part 11 and the light receiving part 12. Light from the light emitting part 11 is received by the light receiving part 12 or intercepted according to the position of object 15. Light emitting part 11 may be self-luminous or may be of a type excitedly an electrical signal. Light receiving part 12 is a conventional device effective for generating a light reception signal having an amplitude that varies according to the quantity of received light.

The aforementioned light reception signal is amplified by an amplifier 13. A combination of the light receiving part 12 and the amplifier 13 is called a photoelectric conversion part 14.

Reference numeral 16 denotes a comparator, wherein a threshold voltage set by a resistance 17, is applied to a minus (−) input. The threshold is compared with the light reception signal from the photoelectric conversion unit 14 which is impressed on the plus (+) input of comparater 16.

A condensing lens (not shown) is disposed on the front of the light emitting part 11 and the light receiving part 12.

In the aforementioned construction, the light emitting part 11 is supplied with a pulse signal as illustrated and emits a corresponding pulsating light. If the object 15 is not present at an intercepting position, the light reaches the light receiving part 12, where it is subjected to photoelectric conversion. The resulting light reception signal from the photelectric conversion unit 14 is compared with a threshold Vs in the comparator 16. If the object 15 is not present at an intercepting position, then a pulse signal, synchronized with an incoming signal to the light emitting part 11, is generated. On the other hand, if the object 15 is present at the intercepting position, a signal of the comparator 16 remains at a constant level "L".

Thus, whether or not the object 15 is present at a predetermined position is identified by the nature of the outgoing signal from the comparator 16.

The output of the aforementioned comparator 16 is either inverted or not according to whether or not a magnitude of the light reception signal is above or below the preset threshold Vs. This threshold is fixed in the prior art system. Therefore, when a quantity of light emitted by the light emitting part 11 increases or decreases over time, or the received light increases or decreases due to changing transmission conditions such as mist, oil film or the like, the light reception signal changes its relationship with the threshold. This may cause an operation error to occur. Consequently, the threshold must be readjusted to comply with the time-dependent and ambient changes.

SUMMARY OF THE INVENTION

An object of the invention is therefore to provide a light identifying system free from operation errors arising due to changes in secular or ambient conditions, or other causes.

The light identifying system according to the invention has a photoelectric conversion unit for receiving a light from the light emitting part on the light receiving part, and for generating a light reception signal having a magnitude that varies according to the quantity of received light. A peak holding circuit has a time constant that is large compared to the lighting cycle of the light emitting part. The holding circuit stores the peak value of the light reception signal over its time constant. A comparator receives the peak value held by the peak holding circuit, and compares it with the light reception signal as a threshold.

In the invention, a peak value of the light reception signal is held, and the peak value thus held is used as a threshold for comparison with the light reception signal. Therefore in the event of an increase or decrease in the quantity of emitted light due to a secular change or of decrease in the quantity of received light due to mist, oil film and the like, the threshold increases or decreases accordingly, and thus the presence of an object blocking the light can be identified accurately at all times without operation error.

DETAILED DESCRIPTION OF THE PREFERRED EMBODIMENT

The invention will now be described with reference to the accompanying drawings representing one preferred embodiment thereof.

Figure 1:
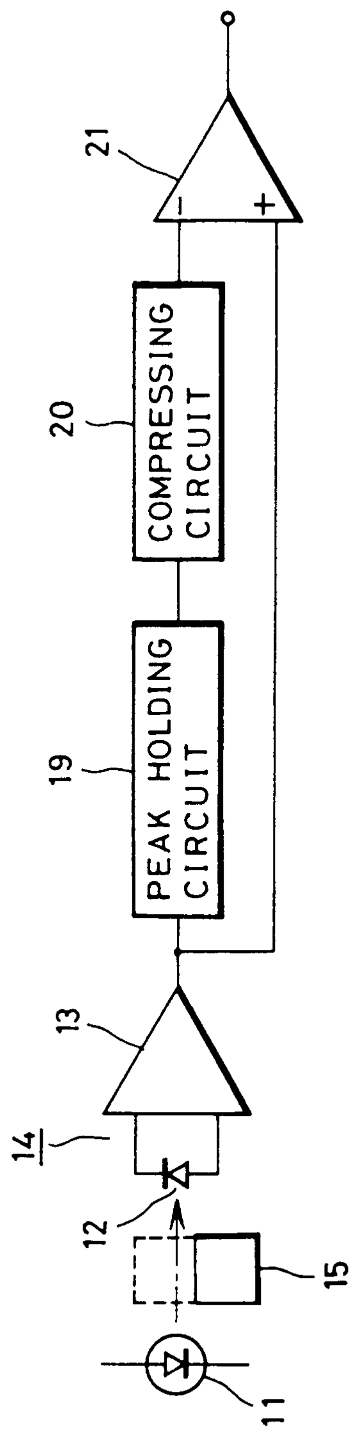
FIG. 1 is a block diagram of a light identifying system according to one embodiment of the invention.

In FIG. 1, the photoelectric conversion unit 14 receives light from the light emitting part 11 on the light receiving part 12 as before. Photoelectric conversion unit 14 produces a light reception signal that varies in magnitude according to the quantity of received light.

A reference numeral 19 denotes a peak holding circuit, which receive the light reception signal and holds the peak value of the light reception signal for a time constant set beforehand. The time constant is very large compared with a cycle time of the light emitting part 11. For example, the cycle time of light emitting part 11 may be from several 10 μs to several ms emitting time (or a frequency from several kHz to 100 kHz). The time constant in the peak holding circuit 19 is set at several seconds to several tens of seconds.

A reference numeral 20 denotes a compressing circuit, which compresses the peak value held on the peak holding circuit 19 in a predetermined ratio of 1/K.

A reference numeral 21 denotes a comparator, having the light reception signal from the photoelectric conversion unit 14 applied to its plus (+) input and the signal compressed to 1/K by the compressing circuit 20 applied as a threshold to its minus (−) input.

Figure 2:
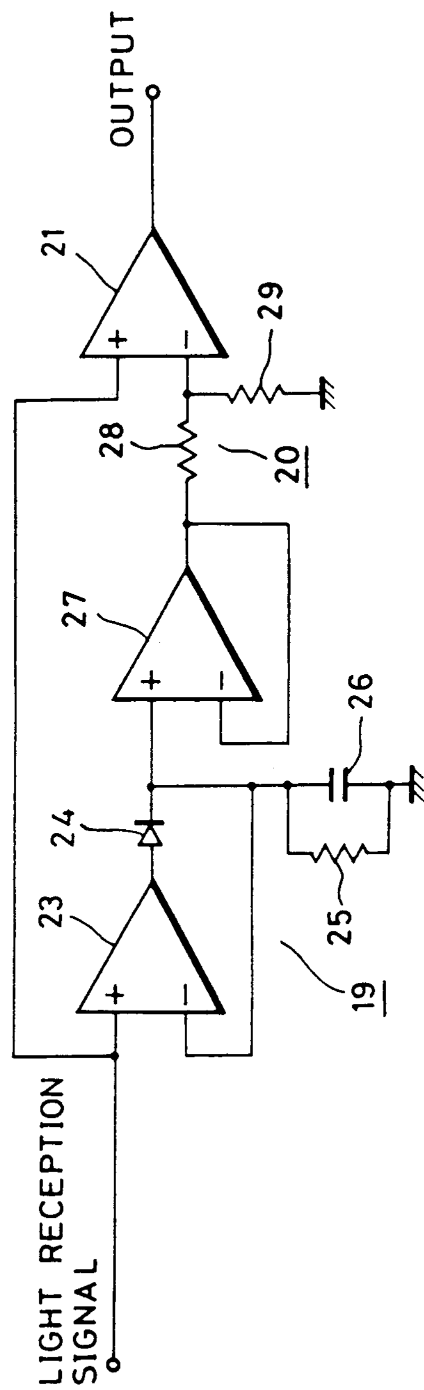
FIG. 2 is a circuit diagram showing a portion of the circuit in FIG. 1.

FIG. 2 shows an example of a circuit configuration of the peak holding circuit 19, the compressing circuit 20, and the comparator 21 shown in FIG. 1. The peak holding circuit 19 includes an operational amplifier 23 with a diode 24 connected in series with its output. A parallel combination of a resistance 25, and a capacitor 26 set the time constant of the peak holding circuit 19. An output of the peak holding circuit 19 is applied to the compressing circuit 20 through a buffer amplifier 27. The compressing circuit 20 compresses the output of the peak holding circuit 19 by a ratio that is set by a voltage divider formed by resistances 28, 29. The compressed signal is fed to the minus (−) input of the operational amplifier 21 as a threshold. The light reception signal is applied to to plus (+) input of the operational amplifier 21 as described hereinbefore.

In the aforementioned construction, the light emitting part 11 has a predetermined flickering cycle time or frequency. If the object 15 does not intercept the light, from the light emitting part 11, then this flickering light is received on the light receiving part 12. A light reception signal ($\alpha$ in FIG. 4) varies in magnitude corresponding to a quantity of the received flickering light. The light reception signal is applied to the plus (+) input of the comparator 21. The peak value of the light reception signal is held for a long time constant by the peak holding circuit 19. Further, the peak value thus held is compressed in a predetermined ratio 1/K by the compressing circuit 20, which provides a threshold ($\beta$ in FIG. 4) for the comparator 21.

Figure 4:
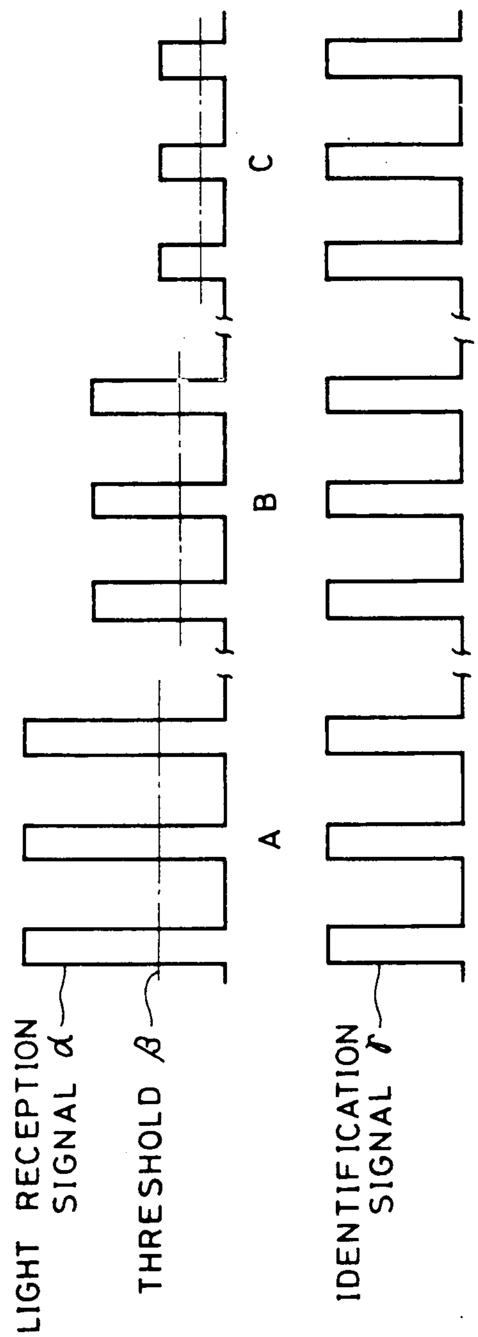
FIG. 4 is a timing diagram for illustrating the operation of the invention.
Figure 5:
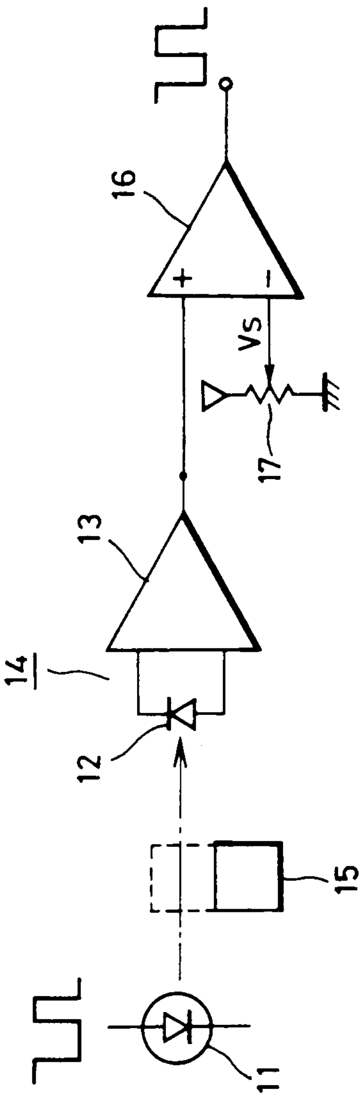
FIG. 5 is a block diagram light identifying circuit according to the prior art.

Since the time constant of the peak holding circuit 19 is much longer than the lighting time interval of the light emitting part 11, the threshold is substantially constant over the short term as indicated by $\beta$ of FIG. 4. The threshold level varies slowly with slow changes in the peak output level of the peak holding circuit 19.

Whenever the light reception signal $\alpha$ exceeds the threshold $\beta$, the output of the comparator 21 changes to an "H" level. Accordingly, a constant-amplitude identification signal $\gamma$, synchronized with the light reception signal $\alpha$, is obtained from the comparator 21.

If the magnitude of the light reception signal $\alpha$ changes as, for example, (A), (B) and (C) of FIG. 4 according to secular changes, ambient conditions and others, the threshold $\beta$ changes proportionately since its value is developed by compressing the light reception signal $\alpha$ by a predetermined ratio of 1/K (1/3 in the example illustrated). Therefore, even if the light reception signal $\alpha$ deteriorates due to secular changes or other causes, operation errors do not occur.

That is, if the light reception signal $\alpha$ deteriorates from (A) to (C) in FIG. 4 due to secular changes or other causes, a threshold fixed at the level $\beta$ of FIG. 4 (A), could not be exceeded by the light reception signal $\alpha$ in the case of (C). Thus the output of the comparator 21 would remain at the "L" level despite the fact that the light is not intercepted. This causes an operation error.

Since the threshold $\beta$ in the invention is a value obtained through holding a peak value of the light reception signal $\alpha$ on a large time constant and compressing it at the ratio 1/K, as long as the object 15 does not prevent the light from the light emitting part 11 reaching the light receiving part 12 a correct output is generated. This result continues even though the light reception signal $\alpha$ may have deteriorated due to secular changes or other causes. The light reception signal remains capable of exceeding the coordinating threshold $\beta$ as shown in (A), (B) and (C) of FIG. 4, and the comparator 21 generates the identification signal $\gamma$ changing to the "H" level in synchronism with incoming signals to the light emitting part 11. That is, whether or not the object 15 is present at a predetermined position can definitely be identified by the change in the identification signal $\gamma$, and thus an operation error does not occur.

Figure 3:
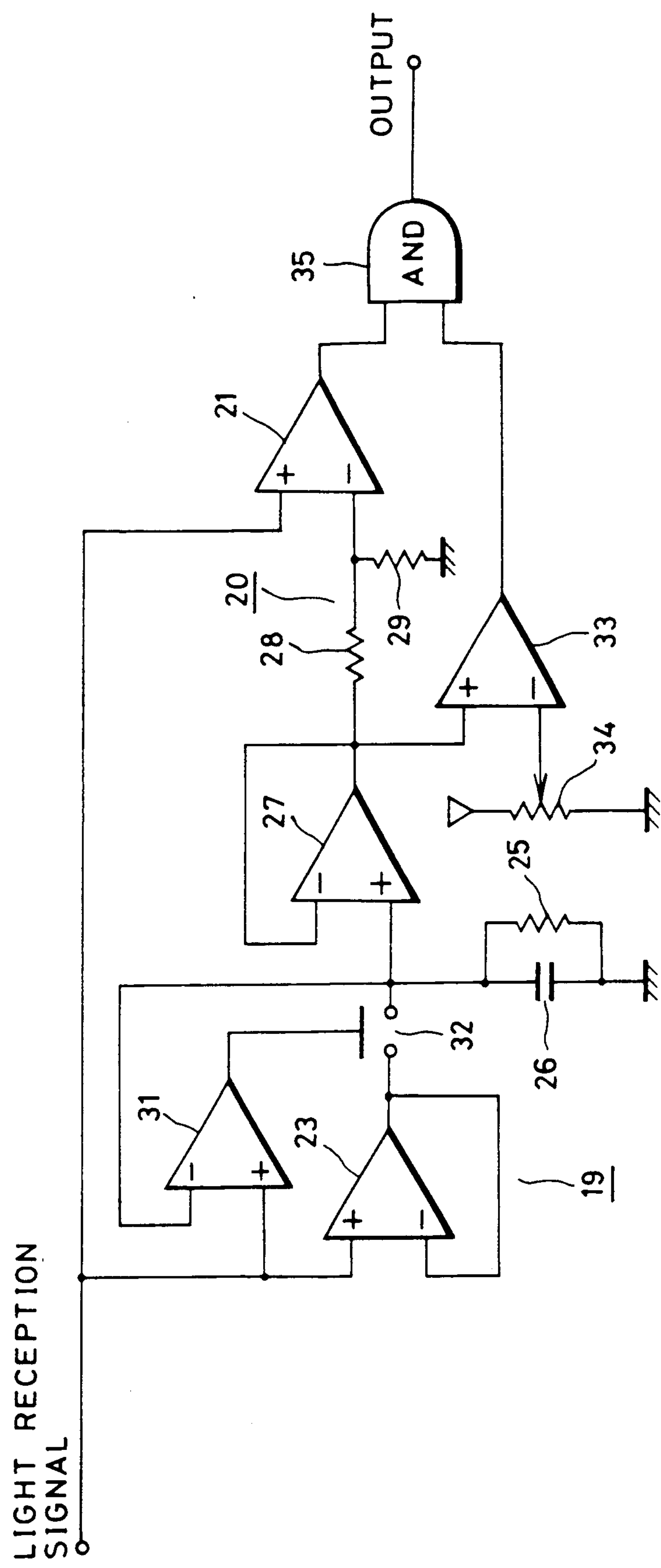
FIG. 3 is a circuit diagram of a light identifying circuit according to another embodiment of the invention.

Referring now to FIG. 3, an analog switch 32 is controlled by the output of an operational amplifier 31. The output of the operational amplifier 23 in peak holding circuit 19 is connected through the analog switch 32 to the parallel combination of capacitance 26 and resistance 25. The analog switch 32 is also connected to the plus (+) input of operational amplifier 27. An operational amplifier 33, operating as a comparator, receives the output of the peak holding circuit 19 through the buffer amplifier 27 at it plus (+) input. A reference voltage, set by a resistance 34, is then applied to the minus (−) input of operational amplifier 33.

On the positive alternations of the light reception signal, operational amplifier 31 closes the analog switch 32, thus connecting the output of operational amplifier 23 to the parallel combination of resistance 25 and capacitance 26 only at these times. During negative alternations of the light reception signal, operational amplifier 31 opens analog switch 32, thereby disconnecting its input. In effect, operational amplifier 31 and analog switch 32 function in a manner similar to the diode 24 of the embodiment of the invention shown in FIG. 2. However, the arrangement in FIG. 3 is superior for implementation in a CMOS intergated circuit.

The comparator 33 detects whether or not the light reception signal has a peak level that is high enough to exceed a noise component in the light reception signal. The reference voltage from resistance 34, is set to a value below which alternations of the light reception signal may be corrupted by noise.

Outputs, of the comparators 33 and 21 are applied to inputs of an AND gate 35. If the amplitude of the light reception signal falls below a set by the threshold voltage fed to the comparator 33, then there is a strong possibility that the signal may be erroneous due to noise. Hence the output of the comparator 21 is blocked by AND gate 35 which receives an "L" level input from the comparator 33. That is, erroneous operation due to noise is prevented.

Improved comparison and identification can be alternated adding a known hysteresis characteristic to comparator 33. Techniques for adding hysteresis to a comparator are so well known that they do not require description.

As described above, according to the invention, if the level of the light reception signal $\alpha$ deteriorates due to secular changes readjustment of the threshold fed to the comparator 21 is not required. Further, the system is also capable of following a slow change in the working atmosphere due to of mist, dust and the like between the light emitting part 11 and the light receiving part 12 without the occurrence of operation error.

What is claimed is:

1. Apparatus for identifying the presence or absence of an object, comprising:

a light emitting part responsive to a pulsed electrical signal for emitting a pulsed light at a pulse interval;

a light receiving part responsive to said pulsed light for producing a light reception signal having a pulsed characteristic at a pulse rate;

a comparator receiving said light reception signal at a first input thereof;

a peak detection circuit including means for storing a peak value of said light reception signal;

said peak detection circuit having a time constant that is large compared to said pulse interval;

a compressing circuit;

said compressing circuit including means for producing a threshold signal equal to said peak value divided by a predetermined value; and said threshold signal being connected to a second input of said comparator, whereby an output of said comparator is a pulse signal in synchronism with said pulsed light when there is no object intercepting said light, and which is constant when an object intercepts said light, whereby the presence or absence of said object is detectable.

2. Apparatus according to claim 1, further comprising:

an AND gate receiving an output of said comparator at a first input;

a second comparator receiving said light reception signal at a first input thereof;

means for applying a second threshold signal to a second input of said second comparator;

an output of said second comparator being connected to a second input of said AND gate; and said second threshold signal being of a value effective to block output of said AND gate when said light reception signal has an amplitude low enough to be polluted by noise.

3. Apparatus according to claim 1, further comprising means for preventing generation of said pulse signal when said light reception signal has an amplitude lower than a predetermined value.

4. Apparatus for detecting the presence of an object comprising:

means for producing a pulsed light signal;

means for detecting said pulsed light signal to produce a light detection signal;

means for holding a peak output of said light detection signal;

means for producing a threshold signal equal to said peak output divided by a predetermined value;

means for producing an alternating output signal responsive to said light detection signal varying above and below said threshold signal; and means for changing said alternating output signal to a constant output signal when said pulsed light signal is blocked by said object from reaching said means for detecting.

5. A method for detecting the presence of an object, comprising:

producing a pulsed light signal;

detecting said pulsed light signal to produce a light detection signal;

holding a peak output of said light detection signal;

producing a threshold signal equal to said peak output divided by a predetermined value;

producing an alternating output signal responsive to said light detection signal varying above and below said threshold signal; and changing said alternating output signal to a constant output signal when said pulsed light signal is blocked by said object from reaching said means for detecting.

* * * * *